(12) United States Patent
Chen (10) Patent No.: US 9,685,937 B2
(45) Date of Patent: Jun. 20, 2017

(54) CMOS PULSE SHRINKING, STRETCHING OR SHRINK-AND-STRETCH MIXING METHOD AND DEVICE THEREOF

(71) Applicant: National Kaohsiung First University of Science and Technology, Kaohsiung (TW)

(72) Inventor: Chun-Chi Chen, Kaohsiung (TW)

(73) Assignee: National Kaohsiung First University of Science and Technology, Kaohsiung (TW)

( * ) Notice: Subject to any disclaimer, the term of this patent is extended or adjusted under 35 U.S.C. 154(b) by 43 days.

(21) Appl. No.: 14/754,792

(22) Filed: Jun. 30, 2015

(65) Prior Publication Data

US 2016/0013780 A1 Jan. 14, 2016

(30) Foreign Application Priority Data

Jul. 10, 2014 (TW) .............................. 103123805 A
Jul. 10, 2014 (TW) .............................. 103123807 A (51) Int. Cl.
*H03H 11/26* (2006.01)
*H03K 5/12* (2006.01)
*H03K 5/133* (2014.01)
*H03K 5/00* (2006.01)

(52) U.S. Cl.
CPC ............... *H03K 5/12* (2013.01); *H03K 5/133* (2013.01); *H03K 2005/00013* (2013.01)

(58) Field of Classification Search
CPC .... H01S 3/0057; H01S 3/005; H01S 3/06754; H01S 3/225; H01S 3/2383
See application file for complete search history.

(56) References Cited

U.S. PATENT DOCUMENTS 6,288,587 B1 * 9/2001 Chen ....................... G04F 10/00
327/261

* cited by examiner

*Primary Examiner* — Sibin Chen
(74) *Attorney, Agent, or Firm* — Alan D. Kamrath; Kamrath IP Lawfirm, P.A.

(57) ABSTRACT

A CMOS pulse shrinking or stretching device includes a basic element sequence, including odd combination positions and even combination positions, and homogeneous logic elements connected to form the basic element sequence. The device further includes an inhomogeneous logic element serially connected between two of the basic elements at the odd or even combination position for shrinking or stretching a pulse signal. A CMOS pulse shrink-and-stretch mixing device further includes an inhomogeneous logic element set, including an odd-positioned inhomogeneous logic element and an even-positioned inhomogeneous logic element to combine stretching and shrinking functions of the pulse signal by adding a stretched pulse and a shrunk pulse signal together.

17 Claims, 4 Drawing Sheets

CMOS PULSE SHRINKING, STRETCHING OR SHRINK-AND-STRETCH MIXING METHOD AND DEVICE THEREOF

BACKGROUND OF THE INVENTION

1. Field of the Invention

The present invention relates to a CMOS pulse shrinking, stretching or shrink-and-stretch mixing method and device thereof. Particularly, the present invention relates to the single-stage CMOS pulse shrinking or stretching method and device thereof. More particularly, the present invention also relates to the double-stage or multi-stage CMOS pulse shrink-and-stretch mixing method and device thereof.

2. Description of the Related Art

By way of example, U.S. Pat. No. 6,288,587, entitled "CMOS Pulse Shrinking Delay Element with Deep Sub-nanosecond Resolution," discloses a CMOS pulse shrinking delay element with a deep subnanosecond resolution applicable to a Time-to-Digital Converter (TDC). The CMOS pulse shrinking delay element includes at least three internal adjacent elements and can control its pulse shrinking or expanding capability by adjusting the size ratio or driving capabilities between two of the at least three internal adjacent elements.

Accordingly, the above CMOS pulse shrinking delay element can avoid adjusting an external bias voltage or can continuously calibrate the conventional CMOS pulse shrinking delay element in order to control pulse shrinking or expanding capabilities, to facilitate simplification of circuits using the delay element, to permit more precise design and control of the pulse shrinking or expanding capabilities of every element in a TDC circuit, and, in practice, to reduce single shot errors in a cyclic TDC utilizing the pulse shrinking delay element to on the order of ten picoseconds, resulting in a TDC having extremely fine resolution, excellent accuracy, low power consumption, and low sensitivity to supply voltage and ambient temperature variations.

However, there is a need of improving the conventional CMOS pulse shrinking, stretching or shrink-and-stretch mixing method and device thereof for modifying the circuit structure and enhancing the functions (e.g. resolution problem). The above-mentioned patent is incorporated herein by reference for purposes including, but not limited to, indicating the background of the present invention and illustrating the situation of the art.

As is described in greater detail below, the present invention provides a CMOS pulse shrinking, stretching or shrink-and-stretch mixing method and device thereof. A plurality of homogeneous logic elements and at least one odd-positioned inhomogeneous logic element (or even-positioned inhomogeneous logic element) is combined to form a pulse shrinking or stretching device. The odd-positioned inhomogeneous logic element (or the even-positioned inhomogeneous logic element) is applied to stretch (or shrink) pulse signals for minimizing dimensions or areas of the circuit and increasing resolution of the device in such a way to mitigate and overcome the above problem. Also, the homogeneous logic elements, at least one of the odd-positioned inhomogeneous logic elements and at least one of the even-positioned inhomogeneous logic elements are combined to form a pulse shrink-and-stretch mixing device.

SUMMARY OF THE INVENTION

The primary objective of this invention is to provide a CMOS pulse shrinking, stretching or shrink-and-stretch mixing method and device thereof. A plurality of homogeneous logic elements and at least one odd-positioned inhomogeneous logic element (or even-positioned inhomogeneous logic element) is combined to form a pulse shrinking or stretching device. The odd-positioned inhomogeneous logic element (or the even-positioned inhomogeneous logic element) is applied to stretch (or shrink) pulse signals for minimizing dimensions or areas of the circuit and increasing resolution of the device. Advantageously, the CMOS pulse shrinking or stretching method and device of the present invention are successful in minimizing dimensions or areas of the circuit, reducing manufacturing cost and increasing resolution.

The CMOS pulse shrinking or stretching method in accordance with an aspect of the present invention includes:

providing a plurality of odd combination positions and a plurality of even combination positions on a basic element sequence which is formed from a series of basic elements;

providing a plurality of homogeneous logic elements and at least one odd-positioned inhomogeneous logic element or at least one even-positioned inhomogeneous logic element for forming a pulse shrinking or stretching device;

serially connecting the odd-positioned inhomogeneous logic element at an odd combination position or serially connecting the even-positioned inhomogeneous logic element at an even combination position to form the pulse shrinking and stretching device; and utilizing the odd-positioned inhomogeneous logic element to stretch a pulse signal or utilizing the even-positioned inhomogeneous logic element to shrink the pulse signal.

In a separate aspect of the present invention, the odd-positioned inhomogeneous logic element and the even-positioned inhomogeneous logic element are arranged together to provide a neutralizer or a neutralizing function of pulse shrinking and stretching.

In a further separate aspect of the present invention, the homogeneous logic element is selected from a logic gate element.

In yet a further separate aspect of the present invention, the logic gate element is a NOT gate element, a AND gate element or other logic gate elements.

In yet a further separate aspect of the present invention, the odd combination position of the basic element sequence includes a start combination position which is a third combination position.

The CMOS pulse shrinking or stretching device in accordance with another aspect of the present invention includes:

a basic element sequence including a plurality of odd combination positions and a plurality of even combination positions;

a plurality of homogeneous logic elements connected to form the basic element sequence; and at least one inhomogeneous logic element serially connected between two of the basic elements to form a pulse shrinking or stretching device;

with the inhomogeneous logic element utilized to shrink or stretch a pulse signal.

In a separate aspect of the present invention, the inhomogeneous logic element is an odd-positioned inhomogeneous logic element or an even-positioned inhomogeneous logic element.

In a further separate aspect of the present invention, the homogeneous logic element is selected from a logic gate element.

In yet a further separate aspect of the present invention, the logic gate element is a NOT gate element, a AND gate element or other logic gate elements.

In yet a further separate aspect of the present invention, the odd combination position of the basic element sequence includes a start combination position which is a third combination position.

Another objective of this invention is to provide a CMOS pulse shrink-and-stretch mixing method and device thereof. A plurality of homogeneous logic elements and at least one inhomogeneous logic element set is combined to form a pulse shrink-and-stretch mixing device. The inhomogeneous logic element set includes an odd-positioned inhomogeneous logic element and an even-positioned inhomogeneous logic element. The inhomogeneous logic element set is applied to stretch (or shrink) pulse signals for minimizing dimensions or areas of the circuit and increasing resolution of the device. Advantageously, the CMOS pulse shrink-and-stretch mixing method and device of the present invention are successful in minimizing dimensions or areas of the circuit, reducing manufacturing cost and increasing resolution.

The CMOS pulse shrink-and-stretch mixing method in accordance with an aspect of the present invention includes:

providing a plurality of odd combination positions and a plurality of even combination positions on a basic element sequence which includes a series of basic elements;

providing a plurality of homogeneous logic elements and at least one inhomogeneous logic element set for forming a pulse shrink-and-stretch mixing device, with the at least one inhomogeneous logic element set including an odd-positioned inhomogeneous logic element and an even-positioned inhomogeneous logic element;

serially connecting the odd-positioned inhomogeneous logic element at an odd combination position and serially connecting the even-positioned inhomogeneous logic element at an even combination position to form the pulse shrink-and-stretch mixing device; and utilizing the inhomogeneous logic element set to combine stretching and shrinking functions of a pulse signal by adding a stretched pulse and a shrunk pulse signal together.

The CMOS pulse shrink-and-stretch mixing device in accordance with an aspect of the present invention includes:

a basic element sequence including a plurality of odd combination positions and a plurality of even combination positions;

a plurality of homogeneous logic elements connected to form the basic element sequence;

at least one inhomogeneous logic element set provided on a predetermined position of the basic element sequence;

at least one odd-positioned inhomogeneous logic element provided in the at least one inhomogeneous logic element set, with serially connecting the at least one odd-positioned inhomogeneous logic element at a corresponding odd combination position; and at least one even-positioned inhomogeneous logic element provided in the at least one inhomogeneous logic element set, with serially connecting the at least one even-positioned inhomogeneous logic element at a corresponding even combination position;

with the at least one inhomogeneous logic element set utilized to combine stretching and shrinking functions of a pulse signal by adding a stretched pulse and a shrunk pulse signal together.

In a separate aspect of the present invention, a channel width of the odd-positioned inhomogeneous logic element is different from that of the even-positioned inhomogeneous logic element.

In a further separate aspect of the present invention, a channel width of the odd-positioned inhomogeneous logic element is greater than that of the even-positioned inhomogeneous logic element.

In yet a further separate aspect of the present invention, a channel width of the odd-positioned inhomogeneous logic element is smaller than that of the even-positioned inhomogeneous logic element.

In yet a further separate aspect of the present invention, the basic element sequence further connects with another inhomogeneous logic element set.

In yet a further separate aspect of the present invention, a channel length of the odd-positioned inhomogeneous logic element is different from that of the even-positioned inhomogeneous logic element.

In yet a further separate aspect of the present invention, a channel length of the odd-positioned inhomogeneous logic element is greater than that of the even-positioned inhomogeneous logic element.

In yet a further separate aspect of the present invention, a channel length of the odd-positioned inhomogeneous logic element is smaller than that of the even-positioned inhomogeneous logic element.

In yet a further separate aspect of the present invention, a channel width or length of the odd-positioned inhomogeneous logic element is identical with that of the even-positioned inhomogeneous logic element to identically balance degrees of pulse shrinking and stretching of the pulse signal.

Further scope of the applicability of the present invention will become apparent from the detailed description given hereinafter. However, it should be understood that the detailed description and specific examples, while indicating preferred embodiments of the invention, are given by way of illustration only, since various modifications will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

It is noted that a CMOS pulse shrinking, stretching or shrink-and-stretch mixing method in accordance with the preferred embodiment of the present invention can be applicable to various automatic or semi-automatic pulse shrinking or stretching methods, including systematic temperature measuring methods, for example, which are not limitative of the present invention. Additionally, a CMOS pulse shrinking, stretching or shrink-and-stretch mixing device of the preferred embodiment of the present invention is suitable for various pulse shrinking or stretching systems, including pulse shrinking delay monitoring systems or temperature monitoring systems, for example, which are not limitative of the present invention.

Throughout the specification, unless the context requires otherwise, the technical term "homogeneous logic elements" applied in the CMOS pulse shrinking, stretching or shrink-and-stretch mixing method and device thereof has the meaning of same sizes (i.e. channel widths or lengths) of logic elements (e.g. NOT gate or other logic gate elements) as basic elements, and the technical term "inhomogeneous logic element" used herein has relatively different sizes of logic elements (e.g. AND gate, NOT gate or other logic gate elements) with respect to the homogeneous logic elements.

Figure 1:
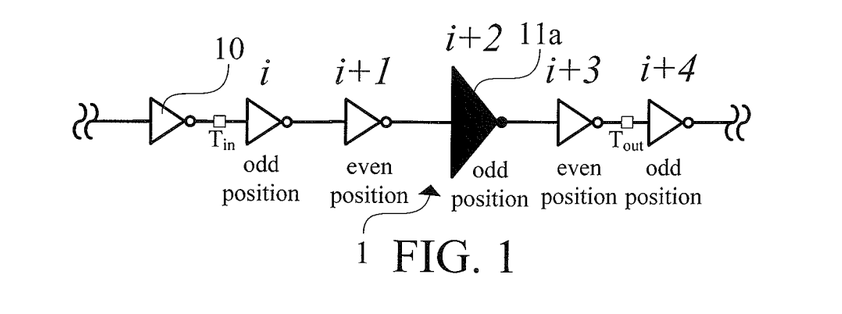
FIG. 1 is a structurally schematic view of a CMOS pulse shrinking or stretching device in accordance with a first preferred embodiment of the present invention.
Figure 1A:
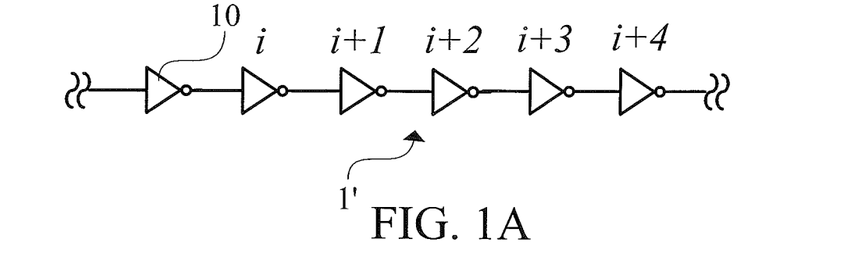
FIG. 1A is a structurally schematic view of a series of basic elements prior to forming the CMOS pulse shrinking or stretching device in accordance with the first preferred embodiment of the present invention.

FIG. 1 shows a structurally schematic view of a CMOS pulse shrinking or stretching device in accordance with a first preferred embodiment of the present invention, and FIG. 1A shows a structurally schematic view of a series of basic elements prior to forming the CMOS pulse shrinking or stretching device, shown in FIG. 1, in accordance with the first preferred embodiment of the present invention. Referring now to FIGS. 1 and 1A, prior to forming the CMOS pulse shrinking or stretching device 1 of the first preferred embodiment of the present invention, a basic element sequence 1' is provided. Comparing with the CMOS pulse shrinking or stretching device 1, the basic element sequence 1' only includes a plurality of homogeneous logic elements 10, which is accordingly incapable of shrinking or stretching an input pulse.

Referring back to FIG. 1, the CMOS pulse shrinking or stretching device 1 of the first preferred embodiment of the present invention includes a plurality of homogeneous logic elements 10 and at least one odd-positioned inhomogeneous logic element 11a (located at a elements 10 and at least one odd-positioned inhomogeneous logic element 11a (located at a relative odd position of the basic element sequence) serially connected to form a pulse shrinking or stretching device. In the CMOS pulse shrinking or stretching device 1, an input pulse $T_{in}$ is passed through the homogeneous logic elements 10 and the odd-positioned inhomogeneous logic element 11a in sequence for pulse stretching. After a predetermined delay time, an output pulse $T_{out}$ is an output end element of the homogeneous logic elements 10.

Referring again to FIGS. 1 and 1A, by way of example, the basic element sequence 1' includes a plurality of odd combination positions (i+2, i+4) and a plurality of even combination positions (i+1, i+3) which are alternatively arranged. The homogeneous logic elements 10 and the odd-positioned inhomogeneous logic element 11a are suitably arranged at the associated odd combination positions and the associated even combination positions for serial connection. The channel width or length of the odd-positioned inhomogeneous logic element 11a is selectively greater than those of the homogeneous logic elements 10 in design. such that the smaller size of all homogeneous logic elements 10 can be selected for reducing the total area of the circuit. Advantageously, the CMOS pulse shrinking or stretching method and device of the present invention is successful in minimizing dimensions or an area of a designed circuit and reducing the manufacturing cost.

With continued reference to FIGS. 1 and 1A, by way of example, the homogeneous logic elements 10 are selected from logic gate elements which are NOT gates or other logic elements (e.g. AND gate elements). Each of the homogeneous logic elements 10 has a function of conducting pulses or the like. However, the input pulses cannot be effectively shrunk or stretched when passing through the two adjacent elements of the homogeneous logic elements 10.

With continued reference to FIGS. 1 and 1A, by way of example, each of the homogeneous logic elements 10 has an identical channel length L and an identical channel width W of transistor elements. A ratio of channel length L and channel width W is greater or smaller than 1 which is applied in the present invention. However, each size (channel width or length) ratio of the homogeneous logic elements 10 is also identical.

Referring back to FIG. 1, the CMOS pulse shrinking or stretching method of the first preferred embodiment of the present invention includes: arranging and serially connecting the odd-positioned inhomogeneous logic element 11a at the odd combination positions (i+2, i+4) of the basic element sequence 1'. Furthermore, there is a relative ratio of internal elements of the odd-positioned inhomogeneous logic element 11a to those of an adjacent one of the homogeneous logic elements 10. The relative ratio represents a degree of pulse stretching of the odd-positioned inhomogeneous logic element 11a.

With continued reference to FIG. 1, by way of example, suppose the transistor length L of the odd-positioned inhomogeneous logic element 11a is identical with that of the adjacent, homogeneous logic elements 10. Existing between the transistor channel widths W of the odd-positioned inhomogeneous logic element 11a and the adjacent homogeneous logic elements 10 is a (transistor) channel width ratio β or other ratio values (greater or smaller than 1). The pulse shrinking or stretching device, for example, is calculated as:

$$R = -\left(\beta - \frac{1}{\beta}\right) C_i \left(\frac{1}{k_{Pi}} - \frac{1}{k_{Ni}}\right) \times \phi \quad (1)$$

$$\phi = \left[\frac{2V_{th}}{(V_{DD} - V_{th})^2} + \frac{1}{(V_{DD} - V_{th})} \ln\left(\frac{1.5V_{DD} - 2V_{th}}{0.5V_{DD}}\right)\right] \quad (2)$$

where R is a value of pulse shrinking or stretching, $C_i$ is an input capacitance of a i-positioned NOT gate element, $K_{Pi}$ and $K_{Ni}$ are k values of p type and n type transistors provided in the i-positioned NOT gate element, and $\phi$ is constant.

Referring again to FIGS. 1 and 1A, by way of example, the odd combination positions of the basic element sequence 1' includes a start combination position which is a third combination position (i+2). Namely, the start combination position for the odd-positioned inhomogeneous logic element 11a cannot be assigned to a first combination position (i) of the basic element sequence 1'.

Referring back to FIG. 1, the CMOS pulse shrinking or stretching method of the first preferred embodiment of the present invention further includes: serially connecting the odd-positioned inhomogeneous logic element 11a at the odd combination position (i+2 or i+4) of the basic element sequence 1'. In a pulse stretching operation, the input pulse $T_{in}$ is stretched through the homogeneous logic elements 10 and the odd-positioned inhomogeneous logic element 11a in sequence and thus to output the output pulse $T_{out}$ after a predetermined delay time.

Figure 2:
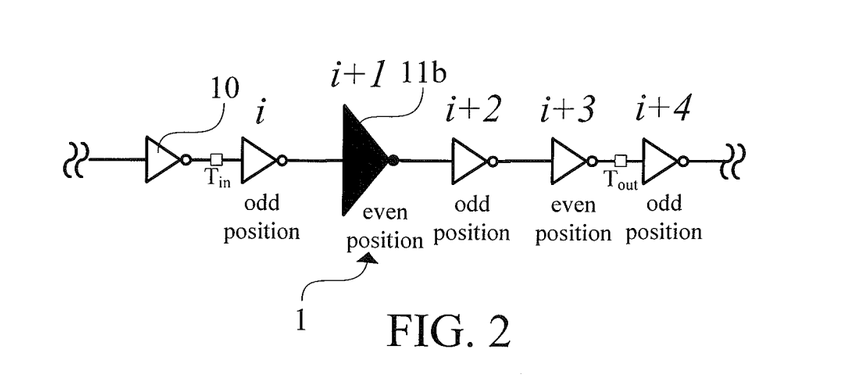
FIG. 2 is a structurally schematic view of the CMOS pulse shrinking or stretching device in accordance with a second preferred embodiment of the present invention.

FIG. 2 shows a structurally schematic view of the CMOS pulse shrinking or stretching device in accordance with a second preferred embodiment of the present invention, corresponding to that shown in FIG. 1. Referring to FIG. 2, in comparison with the first embodiment, the CMOS pulse shrinking or stretching device 1 of the second preferred embodiment of the present invention includes a plurality of homogeneous logic elements 10 and at least one even-positioned inhomogeneous logic element 11b (located at a relative even position of the basic element sequence) serially connected to form a pulse shrinking or stretching device.

With continued reference to FIG. 2, by way of example, the homogeneous logic elements 10 of the second preferred embodiment are selected from logic gate elements having sizes and operational characteristics the same with those shown in the first embodiment, and a detailed description may be omitted.

With continued reference to FIG. 2, the CMOS pulse shrinking or stretching method of the second preferred embodiment of the present invention includes: arranging and serially connecting the even-positioned inhomogeneous logic element 11b at the even combination positions (i+1, i+3) of the basic element sequence V. Furthermore, there is a relative ratio of internal elements of the even-positioned inhomogeneous logic element 11b to those of an adjacent one of the homogeneous logic elements 10. The relative ratio represents a degree of pulse shrinking of the even-positioned inhomogeneous logic element 11b.

With continued reference to FIG. 2, the CMOS pulse shrinking or stretching method of the second preferred embodiment of the present invention further includes: serially connecting the even-positioned inhomogeneous logic element 11b at the even combination position (i+1 or i+3) of the basic element sequence 1'. In a pulse shrinking operation, the input pulse $T_{in}$ is shrunk through the homogeneous logic elements 10 and the even-positioned inhomogeneous logic element 11b in sequence and thus to output the output pulse $T_{out}$ after a predetermined delay time.

Figure 3:
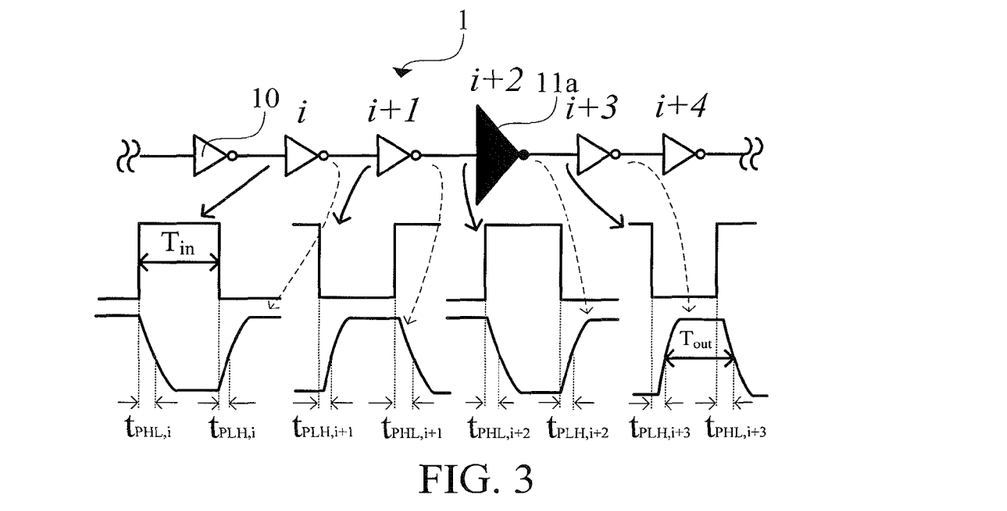
FIG. 3 is a structurally schematic view of the CMOS pulse shrinking or stretching device in accordance with the first preferred embodiment of the present invention with depicting waveforms of pulse signals on associated elements.

FIG. 3 shows a structurally schematic view of the CMOS pulse shrinking or stretching device in accordance with the first preferred embodiment of the present invention, as shown in FIG. 1, with depicting waveforms of pulse signals on associated elements. Referring now to FIGS. 1 and 3, the CMOS pulse shrinking or stretching device 1 in accordance with the first preferred embodiment of the present invention, input waveforms (solid lines in FIG. 3) and output waveforms (dashed lines in FIG. 3) of the associated homogeneous logic elements 10 and the odd-positioned inhomogeneous logic element 11a during a period from inputting the input pulse $T_{in}$ to outputting the output pulse $T_{out}$ are shown for indicating a pulse stretching mechanism of the present invention.

As shown in FIG. 3, the pulse shrinking or stretching mechanism of the CMOS pulse shrinking or stretching device 1 is calculated as:

$$R = \left(\beta - \frac{1}{\beta}\right) C_i \left(\frac{1}{k_{P_i}} - \frac{1}{k_{N_i}}\right) \times \phi \qquad (3)$$

where R is a value of pulse shrinking or stretching, $C_i$ is an input capacitance of a i-positioned NOT gate element, $K_{Pi}$ and $K_{Ni}$ are k values of p type and n type transistors provided in the i-positioned NOT gate element, and $\phi$ is constant.

Figure 4:
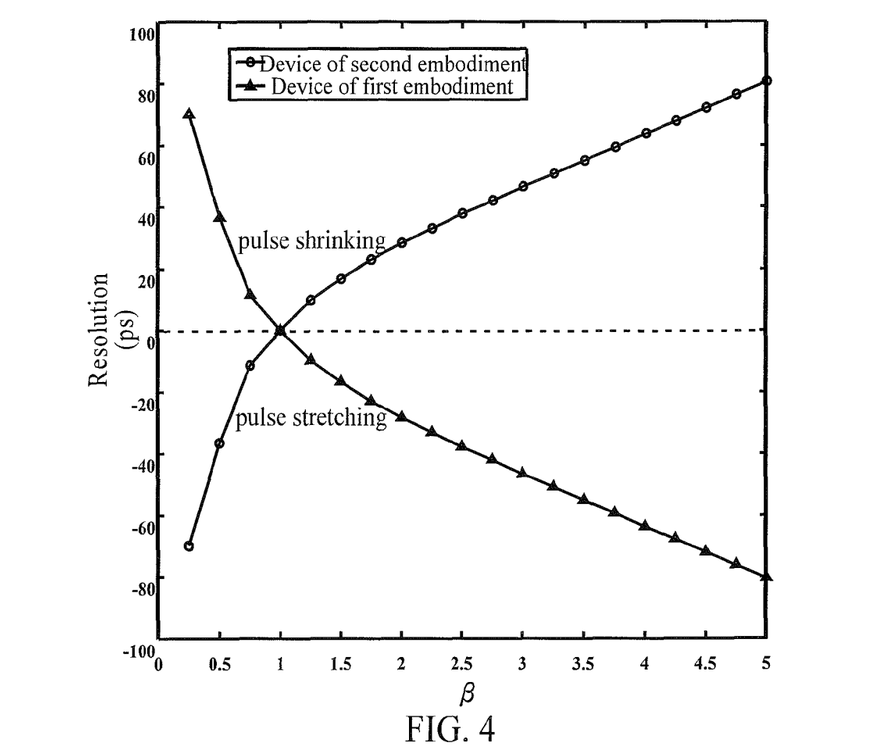
FIG. 4 is a chart of pulse shrinking or stretching resolution R in relation to a size ratio β of the CMOS pulse shrinking or stretching device in accordance with the first preferred embodiment of the present invention comparing with the second embodiment.

FIG. 4 shows a chart of pulse shrinking or stretching resolution R (i.e., amount of pulse-shrinking/pulse-stretching) in relation to the size ratio $\beta$ of the CMOS pulse shrinking or stretching device, as shown in FIGS. 1 and 2, in accordance with the first preferred embodiment of the present invention comparing with the second embodiment. Turning now to FIG. 4, a chart of pulse shrinking or stretching resolution R in relation to the size ratio $\beta$ of the second embodiment is shown by circular rings in FIG. 4. As $\beta$ equals 1, R is also 1, so that no pulse is shrunk or stretched. Conversely, as $\beta$ is smaller or greater than 1, R can be calculated by Equations (1) and (2). If R is greater than zero, the pulse is shrunk, as best shown in an upper portion in FIG. 4. Conversely, if R is smaller than zero, the pulse is stretched, as best shown in a lower portion in FIG. 4.

Referring back to FIGS. 1 and 4, a chart of pulse shrinking or stretching resolution R in relation to the size ratio $\beta$ of the CMOS pulse shrinking or stretching device 1 is shown by triangles in FIG. 4. As $\beta$ equals 1, R is also 0, so that no pulse is shrunk or stretched. Conversely, as $\beta$ is smaller or greater than 1, R can be calculated by Equation (3).

Figure 5:
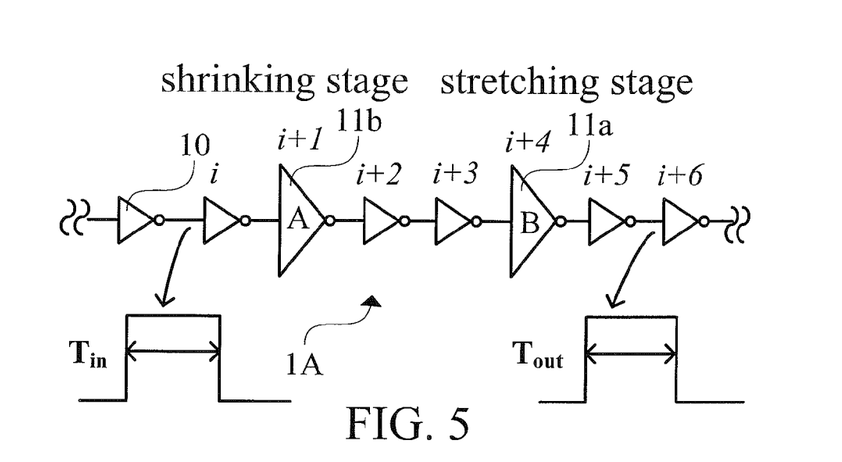
FIG. 5 is a structurally schematic view of a CMOS pulse shrink-and-stretch mixing device in accordance with a third preferred embodiment of the present invention.

FIG. 5 shows a structurally schematic view of the CMOS pulse shrinking or stretching device in accordance with a third preferred embodiment of the present invention, corresponding to those shown in FIGS. 1 and 2. Referring now to FIGS. 1, 2 and 5, in comparison with the first and second embodiments, the first CMOS pulse shrink-and-stretch mixing device 1A of the third preferred embodiment of the present invention includes a plurality of homogeneous logic elements 10, at least one odd-positioned inhomogeneous logic element 11a (located at relative odd position of the basic element sequence) and at least one even-positioned inhomogeneous logic element 11b (located at relative even position of the basic element sequence) serially connected to form a neutralizer or equalizer device.

Referring to FIGS. 1A and 5, the odd-positioned inhomogeneous logic element 11a is serially connected at a relative odd position of the basic element sequence 1', while the even-positioned inhomogeneous logic element 11b is serially connected at a relative even position of the basic element sequence 1'. Suppose the sizes (i.e. width or length) of the odd-positioned inhomogeneous logic element 11a and the even-positioned inhomogeneous logic element 11b are identical, so that a pulse stretching degree resulting from the odd-positioned inhomogeneous logic element 11a can be balanced off by a pulse shrinking degree resulting from the even-positioned inhomogeneous logic element 11b. Advantageously, the first CMOS pulse shrink-and-stretch mixing device 1A can be operated as a neutralizer or equalizer device or to provide a neutralizing or equalizing function. Namely, if an inhomogeneous logic element is arranged in a preferred position of a designed circuit, another inhomogeneous logic element is selectively arranged at a symmetrical position in the designed circuit for partially or completely balancing a degree of pulse shrinking or stretching of the pulse signal.

Figure 6:
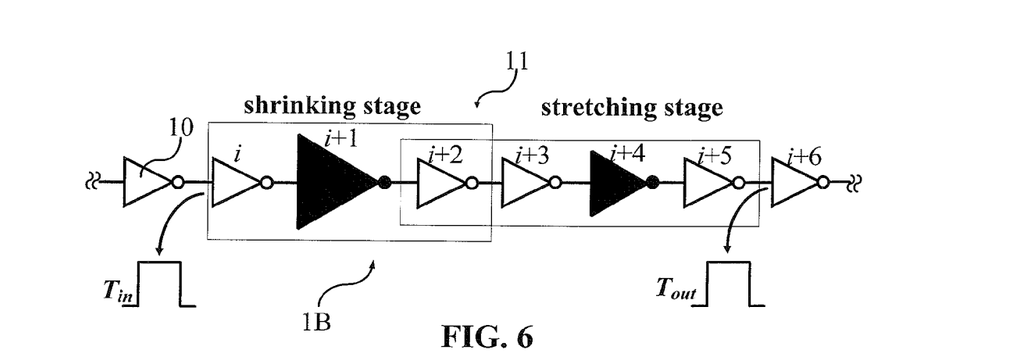
FIG. 6 is a structurally schematic view of a CMOS pulse shrink-and-stretch mixing device in accordance with a fourth preferred embodiment of the present invention.

FIG. 6 shows a structurally schematic view of a CMOS pulse shrink-and-stretch mixing device in accordance with a fourth preferred embodiment of the present invention, corresponding to that shown in FIG. 5. Referring now to FIG. 6, the second CMOS pulse shrink-and-stretch mixing device 1B in accordance with the fourth preferred embodiment of the present invention provides a mixing function of multiple stages of at least one element set, including two stages, four stages, or other numbers of stages, to control pulse shrinking and stretching together.

With continued reference to FIG. 6, the second CMOS pulse shrink-and-stretch mixing device 1B in accordance with the fourth preferred embodiment of the present invention includes a plurality of homogeneous logic elements 10 and at least one inhomogeneous logic element set 11. The inhomogeneous logic element set 11 has a pulse shrinking stage (left side) and a pulse stretching stage (right side) for firstly shrinking a pulse signal and further stretching the pulse signal. In an alternative, the inhomogeneous logic element set 11 has a pulse stretching stage (left side) and a pulse shrinking stage (right side) for firstly stretching the pulse signal and further shrinking the pulse signal. Advantageously, the second CMOS pulse shrink-and-stretch mixing device 1B is successfully combining a shrunk pulse and a stretched pulse for mixing the functions of pulse shrinking and stretching.

Figure 6A:
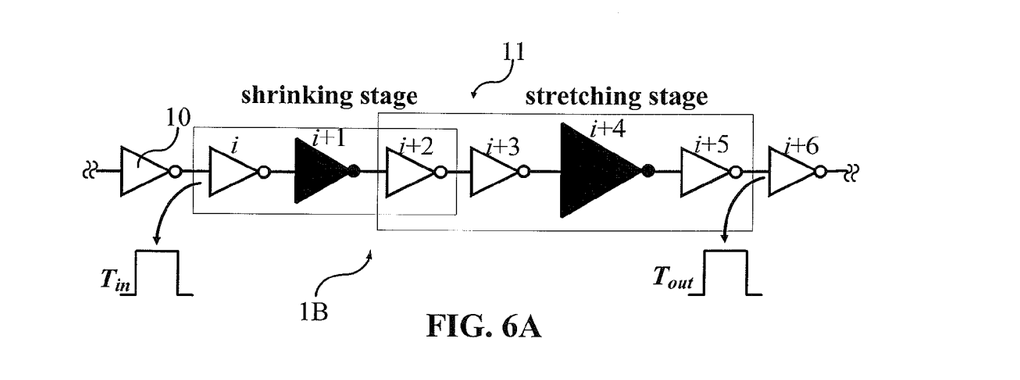
FIG. 6A is a structurally schematic view of a CMOS pulse shrink-and-stretch mixing device in accordance with a fifth preferred embodiment of the present invention.
Figure 6B:
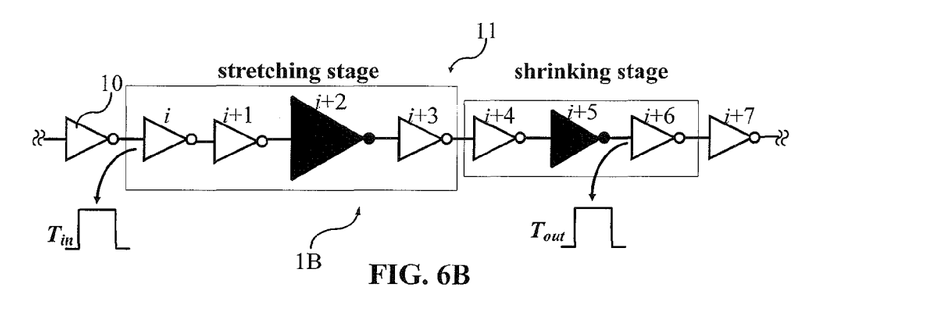
FIG. 6B is a structurally schematic view of a CMOS pulse shrink-and-stretch mixing device in accordance with a sixth preferred embodiment of the present invention.

FIG. 6A shows a structurally schematic view of a CMOS pulse shrink-and-stretch mixing device in accordance with a fifth preferred embodiment of the present invention, and FIG. 6B shows a structurally schematic view of a CMOS pulse shrink-and-stretch mixing device in accordance with a sixth preferred embodiment of the present invention, corresponding to that shown in FIG. 6. Referring now to FIGS. 6, 6A and 6B, the inhomogeneous logic element set 11 includes a first inhomogeneous logic element (left side in FIGS. 6, 6A and 6B) and a second inhomogeneous logic element (right side in FIGS. 6, 6A and 6B). As best shown in FIGS. 6 and 6B, the first inhomogeneous logic element has a size greater than that of the second inhomogeneous logic element, but all of the first and second inhomogeneous logic elements have a size greater than that of the homogeneous logic elements to minimize the total dimensions of the circuit in design. Conversely, as best shown in FIG. 6A, the first inhomogeneous logic element has a size smaller than that of the second inhomogeneous logic element.

With continued reference to FIGS. 6, 6A and 6B, in the second CMOS pulse shrink-and-stretch mixing device 1B, an input pulse $T_{in}$ is passed through the homogeneous logic elements 10 and the inhomogeneous logic element set 11 in sequence for pulse stretching or shrinking. After a predetermined delay time, an output pulse $T_{out}$ is an output end element of the homogeneous logic elements 10. In another embodiment, the second CMOS pulse shrink-and-stretch mixing device 1B further includes another inhomogeneous logic element set to further connect with the basic element sequence.

Referring back to FIG. 1, the odd-positioned inhomogeneous logic element 11a is arranged and serially connected at the odd combination positions (i+2 or 1+4) of the basic element sequence 1', as best shown in FIG. 1A, for a pulse stretching operation. Referring back to FIG. 2, the even-positioned inhomogeneous logic element 11b is arranged and serially connected at the even combination positions (i+1 or i+3) of the basic element sequence 1', as best shown in FIG. 1A, for a pulse shrinking operation.

Figure 7:
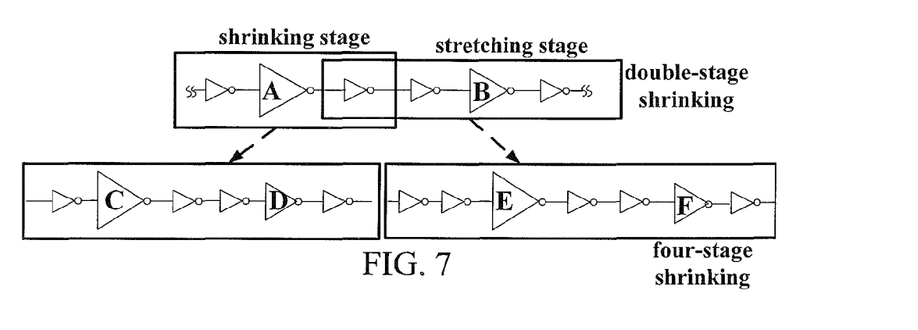
FIG. 7 is a structurally schematic view of a CMOS pulse shrink-and-stretch mixing device in accordance with a seventh preferred embodiment of the present invention, comparing with that of the fourth embodiment.

FIG. 7 is a structurally schematic view of a CMOS pulse shrink-and-stretch mixing device in accordance with a seventh preferred embodiment of the present invention, comparing with that of the fourth embodiment shown in FIG. 6. Referring now to FIGS. 6 and 9, in comparison with the two stages (identified as "A" and "B") of the fourth embodiment, as best shown at upper portion in FIG. 7, the CMOS pulse shrink-and-stretch mixing device in accordance with the seventh preferred embodiment of the present invention has four stages, as best shown at a lower portion in FIG. 7. The inhomogeneous logic element set 11 has a pulse shrinking stage (left side) and a pulse stretching stage (right side). The pulse shrinking stage of the inhomogeneous logic element set 11 includes an even-positioned inhomogeneous logic element "C" and an odd-positioned inhomogeneous logic element "D" serially connected in the homogeneous logic elements in sequence. Similarly, the pulse shrinking stage of the inhomogeneous logic element set 11 includes an odd-positioned inhomogeneous logic element "E" and an even-positioned inhomogeneous logic element "F" serially connected in the homogeneous logic elements in sequence.

The present invention achieves performance improvements in the immunity against the temperature and process variations as well as in the area reduction. Since the effective resolution is determined according to the size ratios of the two inhomogeneous gates, the smallest size of the numerous homogeneous gates can be utilized to reduce the overall circuit area substantially. However, in the single-stage pulse-shrinking device, the large size of the homogeneous NOT gates must be selected to suppress variations in resolution that unavoidably results in a larger circuit area. Advantageously, the above problem can be solved in the pulse-mixing device of the present invention by utilizing only two inhomogeneous gates with greater size ratios ($\beta_A$, $\beta_B$). In short, the double-stage pulse-mixing device of the present invention can minimize both the area and the fluctuation of resolution comparing with the single-stage device.

Although the invention has been described in detail with reference to its presently preferred embodiments, it will be understood by one of ordinary skill in the art that various modifications can be made without departing from the spirit and the scope of the invention, as set forth in the appended claims.

What is claimed is:

1. A CMOS pulse shrinking or stretching method comprising:
   providing a plurality of odd combination positions and a plurality of even combination positions on a basic element sequence which is formed from a series of basic elements;
   providing a plurality of homogeneous logic elements and at least one odd-positioned inhomogeneous logic element or at least one even-positioned inhomogeneous logic element for forming a pulse shrinking or stretching device;
   serially connecting the at least one odd-positioned inhomogeneous logic element at an associated odd combination position or serially connecting the at least one even-positioned inhomogeneous logic element at an associated even combination position to form the pulse shrinking and stretching device; and utilizing the at least one odd-positioned inhomogeneous logic element to stretch a pulse signal or utilizing the at least one even-positioned inhomogeneous logic element to shrink the pulse signal, wherein the at least one odd-positioned inhomogeneous logic element and the at least one even-positioned inhomogeneous logic element are arranged together to provide a neutralizer or a neutralizing function of pulse shrinking and stretching.

2. The CMOS pulse shrinking or stretching method as defined in claim 1, wherein each homogeneous logic element is selected from a logic gate element.

3. The CMOS pulse shrinking or stretching method as defined in claim 2, wherein the logic gate element is a NOT gate element or a AND gate element.

4. The CMOS pulse shrinking or stretching method as defined in claim 1, wherein the associated odd combination position of the basic element sequence includes a start combination position which is a third combination position.

5. A CMOS pulse shrinking or stretching device comprising:
   a basic element sequence including a plurality of odd combination positions and a plurality of even combination positions;
   a plurality of homogeneous logic elements connected to form the basic element sequence; and
   at least one inhomogeneous logic element serially connected between two basic elements to form a pulse shrinking or stretching device;
   wherein the at least one inhomogeneous logic element is utilized to shrink or stretch a pulse signal, and wherein the at least one inhomogeneous logic element is an odd-positioned inhomogeneous logic element or an even-positioned inhomogeneous logic element, with the odd-positioned inhomogeneous logic element and the even-positioned inhomogeneous logic element arranged together to provide a neutralizer or a neutralizing function of pulse shrinking and stretching.

6. The CMOS pulse shrinking or stretching device as defined in claim 5, wherein each homogeneous logic element is selected from a logic gate element.

7. The CMOS pulse shrinking or stretching device as defined in claim 6, wherein the logic gate element is a NOT gate element or a AND gate element.

8. The CMOS pulse shrinking or stretching device as defined in claim 5, wherein the inhomogeneous logic element is an odd-positioned inhomogeneous logic element, with an associated odd combination position of the basic element sequence including a start combination position which is a third combination position.

9. A CMOS pulse shrink-and-stretch mixing device comprising:
   a basic element sequence including a plurality of odd combination positions and a plurality of even combination positions;
   a plurality of homogeneous logic elements connected to form the basic element sequence;
   at least one inhomogeneous logic element set provided on a predetermined position of the basic element sequence;
   at least one odd-positioned inhomogeneous logic element provided in the at least one inhomogeneous logic element set, with serially connecting the at least one odd-positioned inhomogeneous logic element at an associated odd combination position; and
   at least one even-positioned inhomogeneous logic element provided in the at least one inhomogeneous logic element set, with serially connecting the at least one even-positioned inhomogeneous logic element at an associated even combination position;
   wherein the at least one inhomogeneous logic element set is utilized to combine stretching and shrinking functions of a pulse signal by adding a stretched pulse and a shrunk pulse signal together.

10. The CMOS pulse shrink-and-stretch mixing device as defined in claim 9, wherein a channel width of the at least one odd-positioned inhomogeneous logic element is different from that of the at least one even-positioned inhomogeneous logic element.

11. The CMOS pulse shrink-and-stretch mixing device as defined in claim 9, wherein a channel width of the at least one odd-positioned inhomogeneous logic element is greater than that of the at least one even-positioned inhomogeneous logic element.

12. The CMOS pulse shrink-and-stretch mixing device as defined in claim 9, wherein a channel width of the at least one odd-positioned inhomogeneous logic element is smaller than that of the at least one even-positioned inhomogeneous logic element.

13. The CMOS pulse shrink-and-stretch mixing device as defined in claim 9, wherein the basic element sequence further connects with another inhomogeneous logic element set.

14. The CMOS pulse shrink-and-stretch mixing device as defined in claim 9, wherein a channel length of the at least one odd-positioned inhomogeneous logic element is different from that of the at least one even-positioned inhomogeneous logic element.

15. The CMOS pulse shrink-and-stretch mixing device as defined in claim 9, wherein a channel length of the at least one odd-positioned inhomogeneous logic element is greater than that of the at least one even-positioned inhomogeneous logic element.

16. The CMOS pulse shrink-and-stretch mixing device as defined in claim 9, wherein a channel length of the at least one odd-positioned inhomogeneous logic element is smaller than that of the at least one even-positioned inhomogeneous logic element.

17. The CMOS pulse shrink-and-stretch mixing device as defined in claim 9, wherein a channel width or length of the at least one odd-positioned inhomogeneous logic element is identical with that of the at least one even-positioned inhomogeneous logic element to identically balance degrees of pulse shrinking and stretching of the pulse signal.

\* \* \* \* \*